(12) United States Patent
Huang et al.

(10) Patent No.: US 9,848,503 B2
(45) Date of Patent: Dec. 19, 2017

(54) ELECTRONIC DEVICE

(71) Applicants: HONGFUJIN PRECISION ELECTRONICS(CHONGQING)CO. LTD, Chongqing (CN); HON HAI PRECISION INDUSTRY CO., LTD., New Taipei (TW)

(72) Inventors: Ri-Dong Huang, Shenzhen (CN); Zhao-Yu Wang, Shenzhen (CN); Te-Hsu Wang, New Taipei (TW)

(73) Assignees: HONGFUJIN PRECISION ELECTRONICS (CHONGQING) CO., LTD., Chongqing (CN); HON HAI PRECISION INDUSTRY CO., LTD., New Taipei (TW)

( * ) Notice: Subject to any disclaimer, the term of this patent is extended or adjusted under 35 U.S.C. 154(b) by 110 days.

(21) Appl. No.: 15/075,892

(22) Filed: Mar. 21, 2016

(65) Prior Publication Data
US 2017/0257962 A1    Sep. 7, 2017

(30) Foreign Application Priority Data
Mar. 1, 2016    (CN) .................... 2016 2 0154390 U

(51) Int. Cl.
| H05K 5/02 | (2006.01) |
| F16M 11/24 | (2006.01) |
| F16M 11/04 | (2006.01) |
| H05K 5/00 | (2006.01) |

(52) U.S. Cl.
CPC ......... *H05K 5/0234* (2013.01); *F16M 11/041* (2013.01); *F16M 11/24* (2013.01); *H05K 5/0017* (2013.01); *H05K 5/0221* (2013.01)

(58) Field of Classification Search
CPC .... H05K 5/0234; H05K 5/0221; F16M 11/24; F16M 11/041
See application file for complete search history.

(56) References Cited

U.S. PATENT DOCUMENTS

| 2006/0168866 | A1* | 8/2006 | Yiu | F16M 11/041 40/745 |
| 2006/0268496 | A1* | 11/2006 | Wang | F16M 11/10 361/679.21 |
| 2008/0007904 | A1* | 1/2008 | Chen | F16M 11/10 361/679.06 |
| 2010/0172073 | A1* | 7/2010 | Shen | F16M 11/10 361/679.01 |
| 2015/0382491 | A1* | 12/2015 | Ye | F16M 11/046 248/457 |

* cited by examiner

*Primary Examiner* — Hoa C Nguyen
*Assistant Examiner* — Keith Depew
(74) *Attorney, Agent, or Firm* — ScienBiziP, P.C.

(57) ABSTRACT

An electronic device includes a display, a locking member, a resilient member, and a supporting foot. The locking member is movably mounted to the display and including a protrusion. The resilient member is coupled between the locking member and the display. The supporting foot includes a supporting bracket and a rotating assembly coupled to the supporting bracket. The rotating assembly includes a pivot capable of moving the locking member. The pivot includes a latching slot. When the pivot is inserted into the display, the pivot moves the locking member and deforms the resilient member. When the protrusion aligns with the latching slot of the pivot, the resilient member moves the locking member, to allow the protrusion to engage in the latching slot.

20 Claims, 6 Drawing Sheets

ELECTRONIC DEVICE

FIELD

The subject matter herein generally relates to an electronic device with a display.

BACKGROUND

Electronic devices can include displays. Displays are supported by a structure, which can include a supporting tool. Generally, a supporting foot is fixed to a display by complex fixing structure.

BRIEF DESCRIPTION OF THE DRAWINGS

Implementations of the present technology will now be described, by way of example only, with reference to the figures.

DETAILED DESCRIPTION

Figure 1:
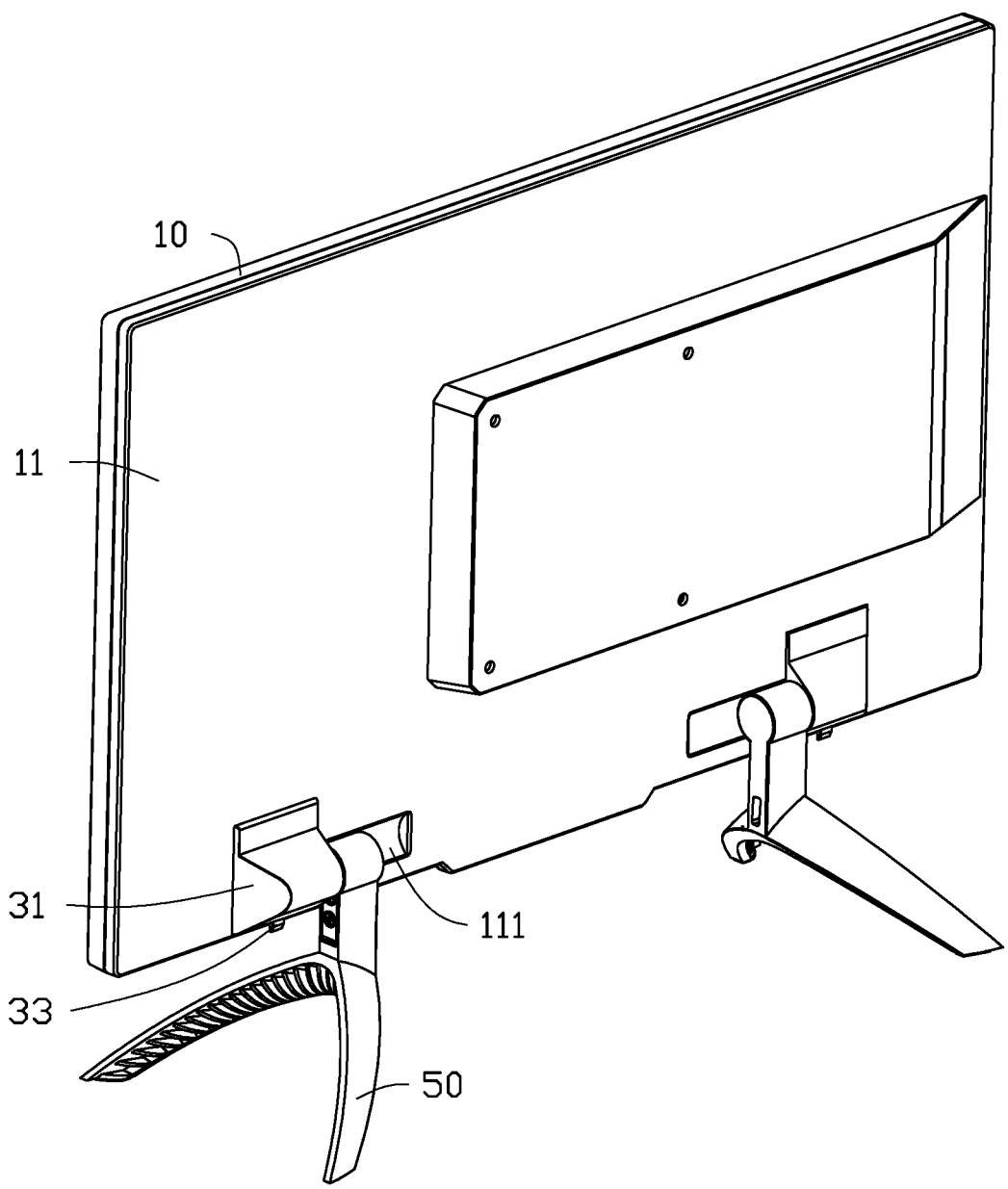
FIG. 1 is an assembled, isometric view of an embodiment of an electronic device, wherein the electronic device includes two supporting feet.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiment described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to an electronic device.

FIG. 1 illustrates an embodiment of an electronic device. The electronic device comprises a display 10, two locking members 33, two resilient members 40 (as shown in FIG. 3), and two supporting feet 50.

Figure 2:
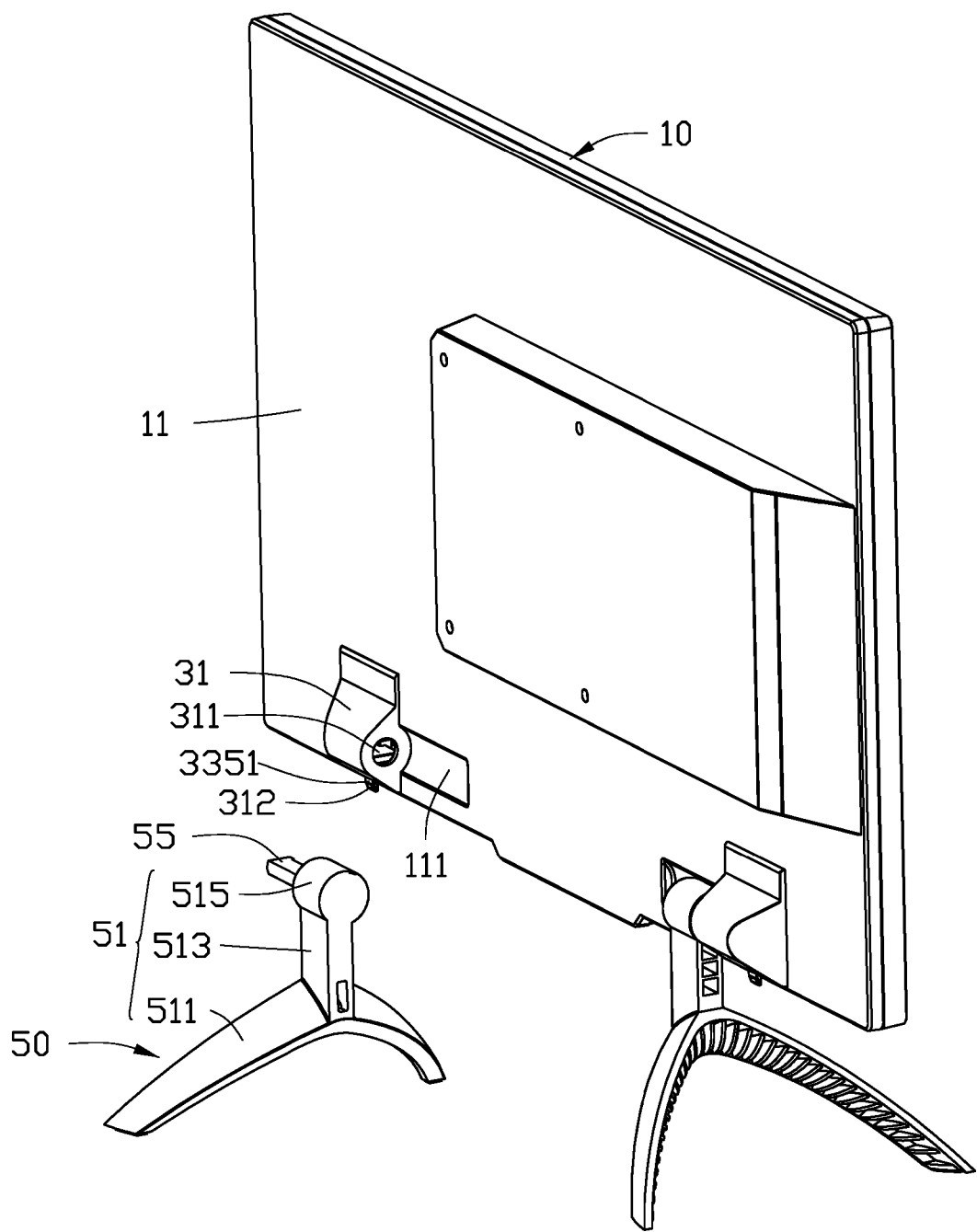
FIG. 2 is an exploded, isometric view of FIG. 1.
Figure 3:
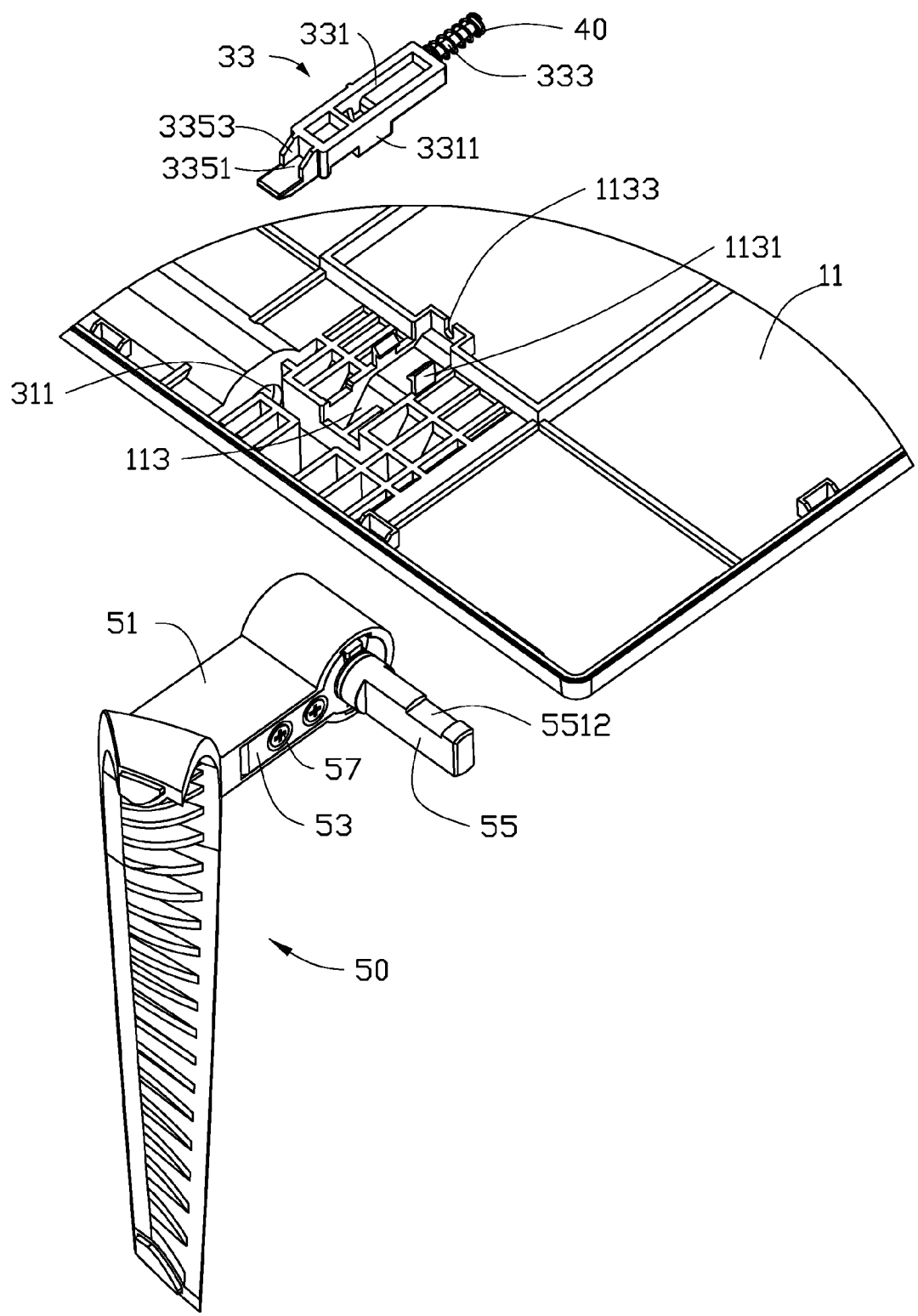
FIG. 3 is a partially exploded view of FIG. 2 from another angle.

FIGS. 2 and 3 illustrate that the display 10 comprises a rear plate 11. Two fixing portions 31 are formed on a lower portion of an outer side of the rear plate 11, and respectively adjacent to opposite ends of the rear plate 11. Two recesses 111 are defined in the outer side of the rear plate 11 between the fixing portions 31, and respectively adjoin with the fixing portions 31. Two receiving portions 113 are formed on an inner side of the rear plate 11, aligning with front sides of the fixing portions 31. Two hooks 1131 are formed on opposite sides of each receiving portion 113. A substantially C-shaped through hole 1133 is defined in a front end of a top wall of each receiving portion 113. A fixing hole 311 is defined in a side of each fixing portion 31, facing towards the adjacent recess 111 and communicating with the corresponding receiving portion 113. A through slot 312 is defined in a bottom of each fixing portion 31, in communication with the corresponding receiving portion 113.

Figure 4:
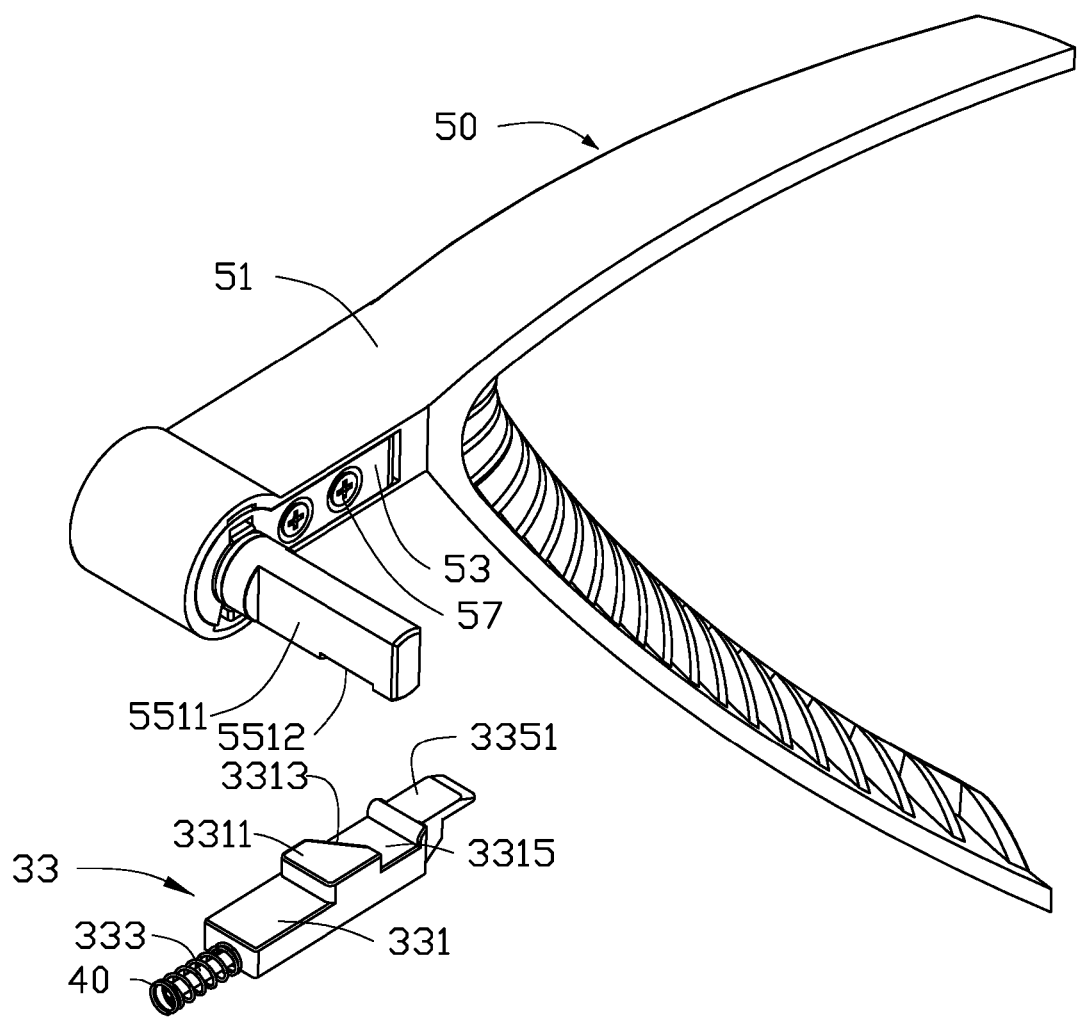
FIG. 4 is a partially enlarged view of FIG. 3 from another angle.

FIGS. 3 and 4 illustrate that each locking member 33 comprises a main body 331, a rod 333 extending up from a top of the main body 331, and an extending plate 3351 protruding down from a rear side of a bottom of the main body 331. A rear side of the extending plate 3351 extends out of a rear side of the main body. A protrusion 3311 extends out from a rear side of the main body 331. An unlocking recess 3315 is defined between the protrusion 3311 and the extending plate 3351. The protrusion 3311 comprises a slanted surface 3313 facing toward the locking recess 3315. Two blocking plates 3353 extend forward from upper portions of opposite sides of the extending plate 3351.

Figure 5:
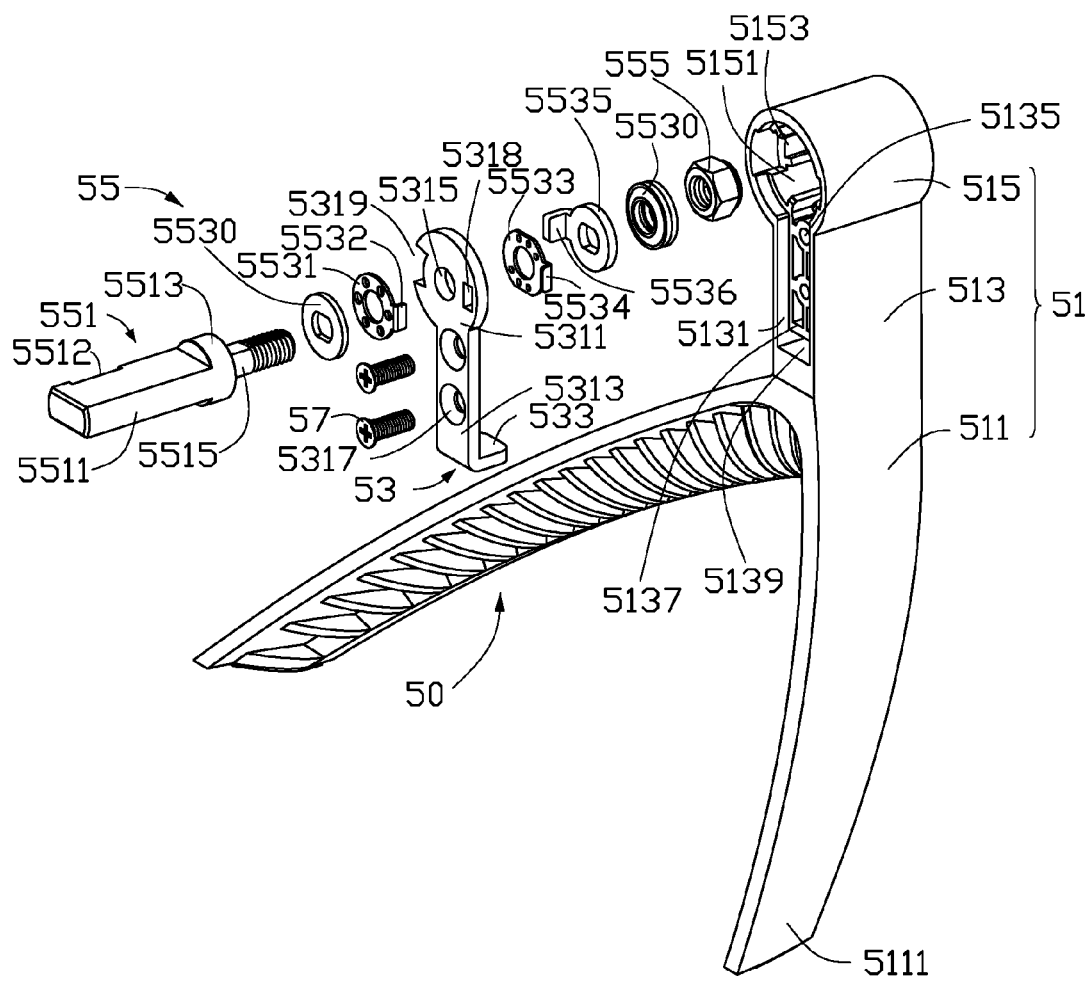
FIG. 5 is an enlarged and exploded view of one of the supporting feet of FIG. 1 from another angle.
Figure 6:
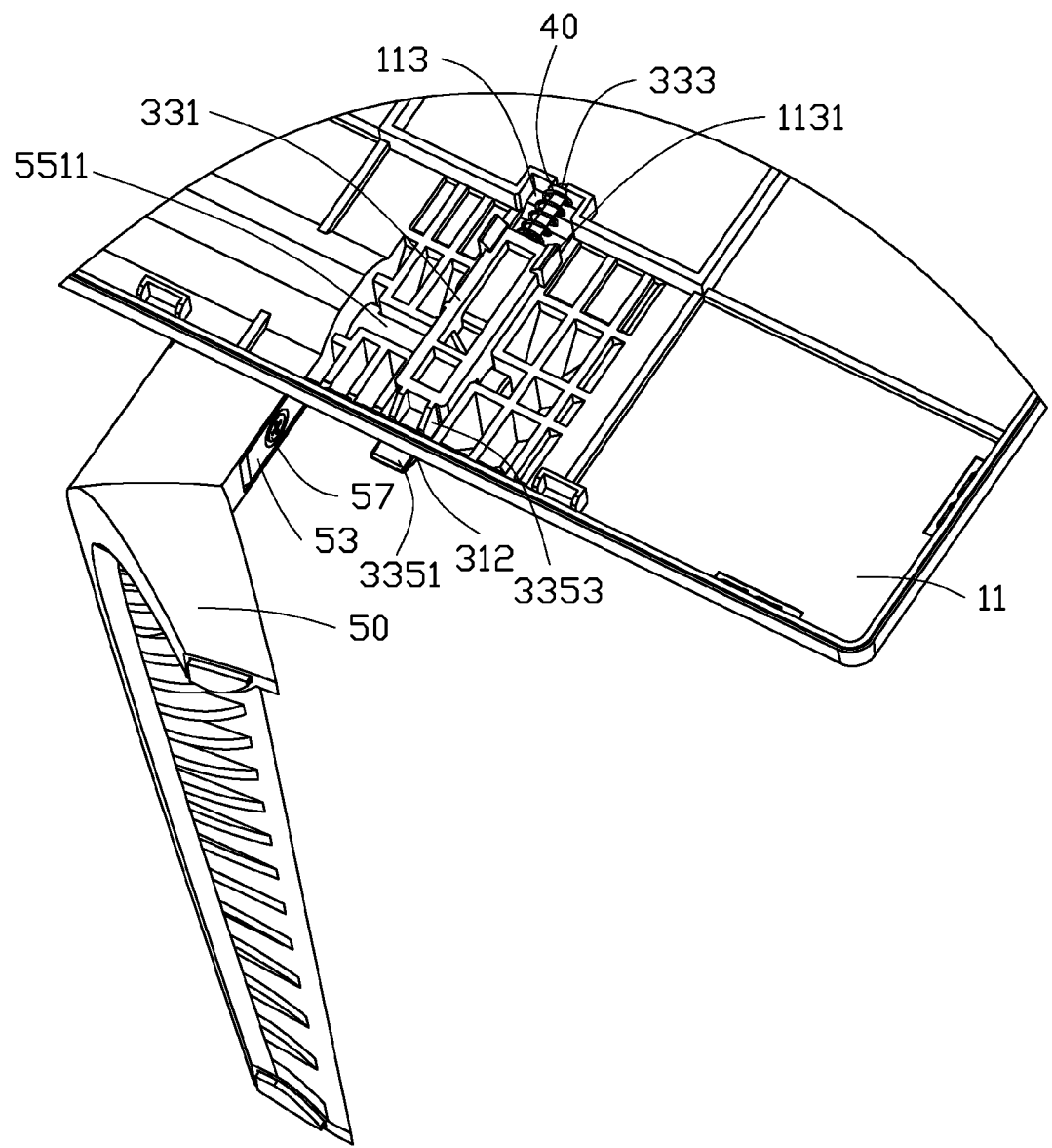
FIG. 6 is an assembled, isometric view of FIG. 3.

FIG. 5 illustrates that each supporting foot 50 comprises a supporting bracket 51, a fixing member 53, a rotating assembly 55, and two fasteners 57. In at least one embodiment, the fasteners 57 are screws.

The supporting bracket 51 comprises a base 511, a coupling portion 513, and a pivot portion 515. The base 511 comprises two feet 5111 with top ends of the feet 511 meeting at an acute angle and coupled to the coupling portion 513. The pivot portion 515 is coupled to a top of the coupling portion 513. A side of the connecting portion 513 and the pivot portion 515 defines a receiving recess 5131. Two spaced fastening holes 5135 are defined in an inner wall 5137 of the receiving recess 5131 in the coupling portion 513. A latching slot 5139 is defined in a lower portion of the inner wall 5137 of the receiving recess 5137, below the fastening holes 5135. A pivot hole 5151 is defined in the pivot portion 515, communicating with the receiving recess 5131 in the pivot portion 515. A plurality of spaced blocks 5153 is formed on an inner side of the pivot portion 515 bounding the pivot hole 5151.

The fixing member 53 comprises a substantially circular locking piece 5311, a mounting piece 5313 extending down from a circumference of the locking piece 5311, and a latch 533 extending substantially perpendicular from a bottom of the mounting piece 5313. A through hole 5315 is defined in a middle of the locking piece 5311. Two spaced through slots 5317 are defined in the mounting piece 5313. A slot 5318 is defined in the locking piece 5311 adjacent to a first side the through hole 5315. A notch 5319 is defined in the circumference of the locking piece 5311 adjacent to a second side of the through hole 5315, opposite to the slot 5318.

The rotating assembly 55 comprises a pivot 551, a plurality of first gaskets 5530, a second gasket 5531 with a hook 5532, a third gasket 5533 with a hook 5534, a fourth gasket 5535 with a hook 5536, and a nut 555. The pivot 551 comprises a substantially rectangular latching post 5511, a circular flange 5513 formed on an end of the latching post 5511, and a threaded post 5515 extending out from a side of the flange 5513 away from the latching post 5511. A latching slot 5512 is defined in a side of the latching post 5511.

To assemble the supporting foot 50, the threaded post 5515 extends through one of the first gaskets 5530, the second gasket 5531, the through hole 5315 of the locking piece 5311, the third gasket 5533, the fourth gasket 5535, two of the first gaskets 5530, and engages in the nut 555. The hook 5532 of the second gasket 5531, and the hook 5534 and the third gasket 5533 engage in the slot 5318 of the locking piece 5311. The hook 5536 of the fourth gasket 5535 engages in the notch 5319 of the locking piece 5311.

The threaded post 5515 is inserted into the pivot hole 5151 of the supporting bracket 51, with the nut 555 pivotably engaging with the blocks 5153. The fixing member 53 is engaged in the receiving recess 5131 of the supporting bracket 51, with the latch 533 engaging in the latching slot 5139 of the supporting bracket 51, and the through slots 5317 aligning with the fastening holes 5135 of the supporting bracket 51. The fasteners 57 extend through the through slots 5317 and engage in the fastening holes 5135, to fix the fixing member 53 to the supporting bracket 51. Thereby, the supporting foot 50 is assembled.

Referring to FIGS. 1-4 and 6, in order to assemble the locking members 33, the resilient members 40, and the supporting feet 50 to the display 10, the resilient members 40 are placed around the rods 333 of the locking members 33. The locking members 33 are received in the receiving portions 113 of the rear plate 11, with the protrusions 3311 facing rearward. The hooks 1131 engage with a front side of the locking members 33. The rods 333 of the locking members 33 engage in the through holes 1133 of the receiving portions 113. The resilient members 40 are sandwiched between the main bodies 331 and the top walls of the receiving portions 113, to urge the locking members 33 to slide downward. The extending plates 3351 extend through the through slots 312 of the rear plate 11, and the blocking plates 3353 engage with an inner wall of the bottom of the rear plate 11. The slanted surfaces 3313 of the protrusions 3311 of the locking members 33 faces towards the fixing holes 311 of the fixing portions 31.

The latching posts 5511 of the rotating assemblies 55 of the supporting feet 50 are moved to extend through the fixing holes 311 and slid into the receiving portions 113 of the rear plate 11. The latching posts 5511 abut against the slanted surfaces 3313 of the locking members 33, and move the locking members 33 upwards to deform the resilient members 40. The latching posts 5511 are further slid into the receiving portions 113. When the latching slots 5512 of the latching posts 5511 align with the protrusions 3311, the resilient members 40 are restored to move the locking members 33 down, to allow the protrusions 3311 to engage in the latching slots 5512. Thereby, the supporting feet 50 are fixed to the display 10. The pivot portions 515 are received in the recesses 111. The display 10 is supported by the supporting feet 50, and is easy and stable to rotate to another pitching angle.

When the extending plates 3351 of the locking members 33 are pressed upward, the protrusions 3311 are disengaged from the latching slots 5512. Then, the latching posts 5511 are moved along the unlocking recesses 3315, and exit out of the receiving portions 113 and the fixing holes 311. Thereby, the supporting feet 50 are easily to be detached from the display 10.

It is to be understood, however, that even though numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. An electronic device comprising:
   a display comprising a rear plate;
   a locking member movably mounted to the rear plate and comprising a protrusion and an extending plate;
   a resilient member coupled between the locking member and the rear plate, the resilient member configured to urge the locking member move towards a first direction and to allow the extending plate to expose out of the rear plate; and
   a supporting foot comprising a supporting bracket and a rotating assembly coupled to the supporting bracket, wherein the rotating assembly comprises a pivot inserted into the rear plate, and the pivot comprises a latching slot to engage with the protrusion of the locking member under a force of the resilient member.

2. The electronic device of claim 1, wherein the protrusion of the locking member comprising a slanted surface, when the pivot is inserted into the rear plate, the pivot abuts against the slanted surface to move the locking member toward a second direction opposite to the first direction, the resilient member is deformed, when the protrusion aligns with the latching slot of the pivot, the resilient member moves the locking member toward the first direction, to allow the protrusion to engage in the latching slot.

3. The electronic device of claim 1, wherein a receiving portion is formed on an inner side of the rear plate, the locking member is slidably received in the receiving portion, two hooks are formed on opposite sides of the receiving portion, to engage with a front side of the locking member.

4. The electronic device of claim 3, wherein a fixing portion is formed on a lower portion of an outer side of the rear plate, aligning with the receiving portion, a fixing hole is defined in a side of the fixing portion communicating with the receiving portion, to allow the pivot to extend therethrough.

5. The electronic device of claim 4, wherein a recess is defined in the outer side of the rear plate adjoining with the fixing portion and communicating with the fixing hole, the supporting bracket comprises a pivot portion coupled to the rotating assembly, the pivot portion is received in the recess.

6. The electronic device of claim 4, wherein a through slot is defined in a bottom of the fixing portion in communication with the receiving portion, to allow the extending plate to extend therethrough.

7. The electronic device of claim 6, wherein the locking member comprises a main body, the extending plate protrudes down from a bottom of the main body, at least one block extends from an upper portion of a side of the extending plate, to engage with a bottom of the rear plate.

8. The electronic device of claim 7, wherein the protrusion extends out from a rear side of the main body, the slanted surface is formed on the protrusion facing towards the extending plate.

9. The electronic device of claim 7, wherein the locking member further comprises a rod extending up from a top of the main body, a substantially C-shaped through hole is defined in a front end of a top of the receiving portion, the rod engages in the through hole, the resilient member is placed around the rod and sandwiched between the main body and the top of the receiving portion.

10. The electronic device of claim 1, wherein the supporting bracket further comprises a base, a coupling portion coupled to a top of the base, and a pivot portion coupled to a top of the coupling portion, the supporting foot further comprises a fixing member fixed to the coupling portion, the rotating assembly is pivotably mounted to the pivot portion by the fixing member.

11. The electronic device of claim 10, wherein the fixing member comprises a locking piece defining a through hole, a slot and a notch, the rotating assembly further comprises a plurality of first gaskets, a second gasket with a hook, a third gasket with a hook, a fourth gasket with a hook, and a nut, the pivot comprises a threaded post extending through one of the first gaskets, the second gasket, the through hole of the locking piece, the third gasket, the fourth gasket, two of the first gaskets, and engaging in the nut, the nut is pivotably engaged in the pivot portion, the hooks of the second gasket and the third gasket engage in the slot of the locking piece, and the hook of the fourth gasket engages in the notch of the locking piece.

12. An electronic device comprising:
a display;
a locking member movably mounted to the display and comprising a protrusion;
a resilient member coupled between the locking member and the display; and
a supporting foot comprising a supporting bracket and a rotating assembly coupled to the supporting bracket, wherein the rotating assembly comprises a pivot capable of moving the locking member, the pivot comprises a latching slot, when the pivot is inserted into the display, the pivot moves the locking member and deforms the resilient member, when the protrusion aligns with the latching slot of the pivot, the resilient member moves the locking member, to allow the protrusion to engage in the latching slot.

13. The electronic device of claim 12, wherein the locking member further comprises an extending plate exposed out of the display under a force of the resilient member.

14. The electronic device of claim 13, wherein the protrusion of the locking member comprises a slanted surface facing towards the extending plate, to engage with the pivot of the supporting foot.

15. The electronic device of claim 13, wherein the display comprises a rear plate, a receiving portion is formed on an inner side of the rear plate, the locking member is slidably received in the receiving portion, a fixing portion is formed on a lower portion of an outer side of the rear plate, aligning with the receiving portion, a through slot is defined in a bottom of the fixing portion in communication with the receiving portion, to allow the extending plate to extend therethrough.

16. The electronic device of claim 15, wherein the locking member further comprises a main body, the extending plate protrudes down from a bottom of the main body, at least one block extends from an upper portion of a side of the extending plate, to engage with a bottom of the rear plate.

17. The electronic device of claim 16, wherein the locking member further comprises a rod extending up from a top of the main body, a substantially C-shaped through hole is defined in a front end of a top of the receiving portion, the rod engages in the through hole, the resilient member is placed around the rod and sandwiched between the main body and the top of the receiving portion.

18. The electronic device of claim 15, wherein two hooks are formed on opposite sides of the receiving portion, to engage with a front side of the locking member.

19. The electronic device of claim 15, wherein a fixing hole is defined in a side of the fixing portion communicating with the receiving portion, to allow the pivot to extend therethrough.

20. The electronic device of claim 19, wherein a recess is defined in the outer side of the rear plate adjoining with the fixing portion and communicating with the fixing hole, the supporting bracket comprises a pivot portion coupled to the rotating assembly, the pivot portion is received in the recess.

* * * * *